(12) United States Patent
Frantz et al.

(10) Patent No.: US 8,467,841 B2
(45) Date of Patent: Jun. 18, 2013

(54) SUPERCONDUCTING MAGNET COIL SYSTEM WITH QUENCH PROTECTION FOR THE PREVENTION OF EXCESSIVE LOCALIZED CURRENTS

(75) Inventors: Wolfgang Frantz, Karlsruhe (DE); Gerald Neuberth, Bruchsal (DE); Gerhard Roth, Rheinstetten (DE)

(73) Assignee: Bruker BioSpin GmbH, Rheinstetten (DE)

( * ) Notice: Subject to any disclaimer, the term of this patent is extended or adjusted under 35 U.S.C. 154(b) by 451 days.

(21) Appl. No.: 12/923,087

(22) Filed: Sep. 1, 2010

(65) Prior Publication Data
US 2011/0065584 A1 Mar. 17, 2011

(30) Foreign Application Priority Data
Sep. 11, 2009 (DE) .......................... 10 2009 029 379

(51) Int. Cl.
*H01F 6/02* (2006.01)
*H01L 39/08* (2006.01)
*G01R 33/035* (2006.01)

(52) U.S. Cl.
USPC ........... 505/162; 505/150; 505/844; 505/879; 335/216; 335/299; 324/318; 361/19

(58) Field of Classification Search
USPC ................. 505/162, 150, 211, 220, 705, 844, 505/845, 850, 851, 879; 324/309, 318, 322; 335/216, 299; 361/19, 141
See application file for complete search history.

(56) References Cited

U.S. PATENT DOCUMENTS

| | | | |
|---|---|---|---|
| 5,644,233 A | 7/1997 | Bird | |
| 5,739,997 A | 4/1998 | Gross | |
| 6,777,938 B2 | 8/2004 | Schlenga | |
| 7,368,911 B2 | 5/2008 | Frantz | |
| 2002/0101239 A1* | 8/2002 | Schauwecker et al. | ....... 324/318 |
| 2002/0171520 A1 | 11/2002 | Yoshikawa | |
| 2008/0007375 A1* | 1/2008 | Frantz | ........................... 335/216 |

FOREIGN PATENT DOCUMENTS

| | | |
|---|---|---|
| GB | 2 431 048 | 4/2007 |
| JP | 11102807 | 4/1999 |
| JP | 2004153146 | 5/2004 |
| JP | 2005353777 | 12/2005 |
| JP | 2010245261 | 10/2010 |

* cited by examiner

*Primary Examiner* — Stanley Silverman
*Assistant Examiner* — Kallambella Vijayakumar
(74) *Attorney, Agent, or Firm* — Paul Vincent

(57) ABSTRACT

A superconducting high-field magnet coil system comprising several radially nested main coil sections (1, 2, 3, 4, 5) which are connected to each other in series in such a fashion that currents of the same direction flow through them during operation, wherein a first main coil section (EHS) is disposed radially further inward than a second main coil section (ZHS) and at least one intermediate main coil section (ZW) is disposed radially between the first and the second main coil section (EHS, ZHS), and with a superconducting switch (11) via which all main coil sections (1, 2, 3, 4, 5) can be superconductingly short-circuited in series, is characterized in that the first main coil section (EHS) and the second main coil section (ZHS) are directly successively series-connected and the first main coil section (EHS) and the second main coil section (ZHS) are bridged by a common quench protection element, which does not bridge the at least one intermediate main coil section (ZW). The magnet coil system realizes quench protection for selectively preventing excess currents in magnet coil areas in which the excessive mechanical force load associated with an excess current would damage the superconductor.

20 Claims, 7 Drawing Sheets

SUPERCONDUCTING MAGNET COIL SYSTEM WITH QUENCH PROTECTION FOR THE PREVENTION OF EXCESSIVE LOCALIZED CURRENTS

This application claims Paris Convention priority of DE 10 2009 029 379.5 filed Sep. 11, 2009 the complete disclosure of which is hereby incorporated by reference.

BACKGROUND OF THE INVENTION

The invention concerns a superconducting high-field magnet coil system comprising
- several radially nested main coil sections which are connected to each other in series in such a fashion that currents flow through them during operation in the same direction, wherein a first main coil section is disposed radially further inward than a second main coil section, and at least one intermediate main coil section is disposed radially between the first and the second main coil section,
- and with a superconducting switch via which all main coil sections can be superconductingly short-circuited in series.

A magnet coil system of this type is disclosed in US 2008/0007375 A1.

Superconducting magnet coil systems are used, in particular, for generating large magnetic field strengths e.g. for NMR spectrometers or MRI tomographs. For this reason, large electric currents generally flow in corresponding superconducting magnet coils during operation. The superconductivity in the magnet coil thereby substantially prevents loss in current flow.

A superconducting magnet coil system is jeopardized by a sudden breakdown of the superconductivity (quench). In case of a quench, the resistance of the magnet coil increases enormously, causing high electric voltages at that location which can damage the superconductor. When the current in the magnet coil is not reduced quickly enough, the superconductor can burn through due to local generation of heat.

For this reason, superconducting magnet coil systems generally take measures for discharging the magnetic flux via protective elements, e.g. resistances, from the coil sections which have become resistive during a quench.

M. N. Wilson "Superconducting Magnets", Oxford University Press, 1983 teaches bridging of coil sections of a magnet coil system with ohmic resistances. The magnet coil system is thereby segmented into loops which are connected in series to each other, wherein each loop comprises one coil section of the magnet system and one resistance which bridges the coil section. Portions having a low self-inductance are thereby generated. The currents quickly decay in these portions and also high voltages are prevented. However, in case of a quench, currents of different strengths flow in the coil sections in the various loops of protective resistances and coil sections. These excess currents can cause unacceptable excessive (Lorentz) forces which can mechanically destroy the conductor. When a superconductor which is loaded with a high current quenches, there is also the danger that, when superconductivity breaks down, the then resistively flowing current generates so much heat that the superconductor burns out.

In another protection variant, the magnet coil system is not divided into different, series-connected and separately protected portions, and quick propagation of the quench is ensured by suitable measures (see also M. N. Wilson "Superconducting Magnets", Oxford University Press, 1983). However, the high voltages in case of a quench cannot be prevented. These high voltages would reach an unacceptable magnitude mainly for highest-field magnet systems, since these systems use superconducting material which must be insulated with a material having a low dielectric strength (e.g. glass fiber fabric).

U.S. Pat. No. 5,644,233 proposes a magnet coil system in which the main field coil and the shielding coil are segmented into equal numbers of coil sections and are connected in series in pairs in order to prevent an excessive stray field compared to steady-state operation in case of a quench. Each coil section pair forms one loop together with an ohmic resistance. Each pair of the coil sections of main field coil and shielding coil, which are connected in series within one loop, have almost the same dipole moment magnitude, but with different signs. This method entails large constructive and productional expense for connecting the radially widely spaced apart coil sections in pairs.

US 2008/0007375 describes a magnet coil arrangement which avoids pairwise connection of radially widely spaced apart coil sections. The magnet coil arrangement contains at least two different superconducting materials, the insulating materials of which have different dielectric strengths. A radially outwardly disposed main coil section has a dipole moment of approximately the same magnitude than the shielding coil but in an opposite direction. The common protection with an ohmic resistance approximately eliminates the dipole moment of the coil arrangement irrespective of the current which flows in this jointly protected area during a quench. An excessive stray field during the quench can thereby be prevented. NbTi-superconductors with an insulation of high dielectric strength are used in the jointly protected area, and for this reason the high electric voltages which occur during a quench do not represent any problem. At locations, where high voltages are likely to cause damage, i.e. in the radially inner main coil area containing a superconducting material (Nb3Sn) with an insulation having a low dielectric strength, the coil is divided into several main coil sections, which are each separately bridged with protective resistances. Any excess current at that location only negligibly influences the stray field, since the inner main coil sections only have a very small dipole moment. However, excessive Lorentz forces due to excess currents in the separately protected main coil sections remain problematic in the radially inner main coil area.

U.S. Pat. No. 5,739,997 describes so-called split-coil magnets, in which two electrically neighboring but not spatially neighboring coils are commonly bridged with quench protection elements. This spatial separation of the coils is an axial separation without intermediate sections in correspondence with the split-coil principle. Within the scope of quench protection, strong excess currents are thereby promoted in order to accelerate propagation of the quench.

It is the underlying purpose of the present invention to propose a magnet coil system that implements quench protection which selectively prevents excess currents in magnet coil areas in which the excessive mechanical force load associated with an excess current would damage the superconductor.

SUMMARY OF THE INVENTION

This object is achieved by a magnet coil system of the above-mentioned type, which is characterized in that the first main coil section and the second main coil section are directly successively electrically connected in series and that the first main coil section and the second main coil section, but not the at least one intermediate main coil section, are bridged by a common quench protection element.

The invention also provides that a first magnet coil area (the first main coil section), which is jeopardized by an excess current in case of a quench, is jointly protected together with a second magnet coil area (the second main coil section), which experiences no or only a sufficiently low excess current. Towards this end, these two magnet coil areas are protected with a quench protection element in a common loop.

The first magnet coil area (the first main coil section) is mechanically extremely sensitive e.g. due to the superconducting material which is used at that location such that any excess current must be prevented to the greatest possible extent at that location. The second magnet coil area (the second main coil section) experiences no or only minor excess currents in case of a quench, since e.g. the quenches start in this second area or the inductive coupling to the quenching area triggers an early quench in this second area.

In order to jointly protect these two magnet coil areas (main coil sections), they are interconnected in a loop with a protective element (e.g. an ohmic resistance and/or a protective diode) which is connected in parallel with the two magnet coil areas. This requires a certain amount of wiring, since the two magnet coil areas to be jointly interconnected are not directly neighboring. The radially outer areas (sections) typically quench at first in a magnet coil system due to the prevailing forces at that location, and the radially inner areas (sections) subsequently experience an excess current. In order to jointly protect these spatially separated magnet coil areas (main coil sections) in one loop, the superconducting connection which is arranged for the series connection of the jointly protected magnet coil areas of the loop, must bridge other magnet coil areas (i.e. one or more intermediate main coils sections) which are spatially disposed between these two magnet coil areas (sections) which are to be jointly interconnected. In case of a quench, the second coil area (the second main coil section) which quenches at first dominates the decay behavior of the current within this loop. For this reason, the first coil area (the first main coil section) arranged in the same loop is protected from excess currents even when it does not itself quench.

In one particularly preferred embodiment, the common quench protection element comprises a quench protection resistance and/or a quench protection diode. The coil area which is subdivided with a quench protection resistance has a lower inductance than the overall coil system, which rapidly reduces the magnetic flux within the partial coil area and prevents high voltages. The quench protection resistance arranged in parallel to the partial coil area also takes over part of the normally conducting coil current. The same also applies when only crossed diodes are used as soon as their forward voltage is exceeded in case of a quench and the magnetic flux can decay within the coil area subdivided with crossed diodes. When the diodes are arranged in series with the protective resistance, the energy input into the protective network is reduced during charging operation of the magnet and thereby the energy input into the liquid helium which is normally used for cooling a superconducting magnet coil. The above-described quench protection function of the protective resistance is thereby maintained.

In another preferred embodiment, the superconducting high field magnet coil system comprises a shielding coil which is connected in series with the main coil sections in such a fashion that a current of opposite direction flows through the shielding coil and the main coil sections during operation. The shielding coil reduces the stray field of the magnet system. When a shielding coil is used, the superconducting switch superconductingly short-circuits in series the main coil sections and the shielding coil.

In a further development of this embodiment, the shielding coil is bridged with its own quench protection element. This protects the shielding coil in case of a quench. Typical quench protection elements are an ohmic resistance or a protective diode.

In another preferred embodiment, the high field magnet coil system comprises one or more further main coil sections which are disposed radially within the first main coil section and/or radially outside of the second main coil section. The sequence of main coil sections and their protection may be determined in accordance with the requirements of the construction and use of the high field magnet coil system.

In a preferred embodiment, the first main coil section is the radially innermost main coil section of the superconducting high field magnet coil system. The radially innermost main coil section can collect particularly large excess currents, in particular, when the magnet coil system has not yet been completely charged, and is therefore particularly vulnerable. This embodiment selectively minimizes this danger.

In an alternative embodiment, the radially innermost main coil section of the superconducting high field magnet coil system is bridged with its own quench protection element. When the radially innermost main coil section is only little jeopardized by excess currents e.g. due to the material selected for the superconductor, a separate quench protection element (e.g. a resistance) may be sufficient at that location.

In another preferred embodiment, the second main coil section is the radially outermost main coil section of the superconducting high field magnet coil system. The radially outermost second main coil area of this embodiment typically quenches at first due to the prevailing forces at that location such that the first main coil area which is jointly protected therewith is optimally protected.

In an alternative embodiment, the radially outermost main coil section of the superconducting high field magnet coil system is bridged with its own quench protection element. This design may simplify the construction, in particular, the wiring of the main coil sections. Typical quench protection elements are ohmic resistances or protective diodes.

In a further advantageous embodiment of the inventive superconducting high field magnet coil system, a first superconducting material of a conductor of the first main coil section has a higher critical magnetic field than a second superconducting material of a conductor of the second main coil section. The magnet coil system of this design can generate extremely high magnetic field strengths. The first material is more at risk due to possible larger excess currents or mechanical forces and local generation of heat, which can, however be selectively compensated for by the inventive loop interwiring.

In an advantageous embodiment, each main coil section of a radially inner main coil area has a conductor with the first superconducting material and each main coil section of a radially outer main coil area has a conductor with the second superconducting material. In this embodiment, the first main coil section can profit from the other properties of the conductor of the second main coil section of the second main coil area, which is protected in the same loop. In this embodiment, all main coil sections typically belong to one of these two main coil areas. In an alternative fashion, three or even more main coil areas may be provided with different superconducting conductor materials.

In a preferred further development of this embodiment, the second main coil section is the radially innermost main coil section of the radially outer main coil area. In this case, the wiring expense is particularly small.

In another particularly preferred embodiment, a first superconducting material of a conductor of the first main coil section comprises Nb3Sn, Nb3Al, MgB2 or a ceramic high-temperature superconducting material, in particular YBCO or Bi2212 or Bi2223. These materials may profit in particular from the invention e.g. due to comparatively low mechanical strength and corresponding high vulnerability in case of a quench. Ceramic high-temperature superconducting materials which may be used, in particular, within the scope of the invention have a transition temperature Tc>60K.

In another particularly preferred embodiment, a second superconducting material of a conductor of the second main coil section comprises NbTi. Coil sections with this superconducting material generally quench early and have small excess currents.

In a preferred embodiment, each main coil section of a radially inner main coil area has a conductor with a high temperature superconducting material,
each main coil section of a radially central main coil area has one conductor with Nb3Sn,
and each main coil section of a radially outer main coil area has a conductor with NbTi. This construction efficiently protects, in particular, in pairs each main coil section of the innermost and central main coil section together with a main coil section of the outermost main coil section. This construction also generates particularly large magnetic field strengths.

In an advantageous embodiment, several joint quench protection elements, in particular quench protection resistances, are provided with which
one first and one second main coil section are jointly bridged, with the respective at least one intermediate main coil section which is disposed radially between the first and the second main coil section not being bridged
wherein the respective first and second main coil sections directly succeed one another in the electric series connection,
and wherein the respective first main coil section is disposed radially further inward than the respective second main coil section.

In other words, several different loops are formed in this embodiment, in which two electrically neighboring but radially not neighboring main coil sections are jointly bridged by a quench protection element. This enables selective protection of several different (first) main coil sections.

In a further development of this embodiment, a critical magnetic field strength of a first superconducting material of a conductor of the respective first main coil section is larger than a critical magnetic field strength of a second superconducting material of a conductor of the respective second main coil section. The protective function can be optimized by the different material properties and radial positions.

In a preferred embodiment, the main coil sections, which are not bridged by a common quench protection element, are each bridged by their own quench protection element. These main coil sections or their superconducting conductors are thereby also protected in a simple fashion from the effects of a quench. Typical quench protection elements are ohmic resistances and protective diodes.

In another preferred embodiment, the superconducting high field magnet coil system is designed for generating a magnetic field with a magnetic field strength $B_0 \geq 9$ tesla, preferably $B_0 \geq 17$ tesla. In particular, in high field magnet coil systems with associated large stored energies, the conductors are at great risk in case of a quench, and for this reason, the invention is particularly advantageous in this case.

The invention also concerns an NMR measuring apparatus, in particular, an NMR spectrometer or MRI tomograph comprising an inventive superconducting high-field magnet coil system.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and explained in more detail with reference to the embodiments.

BRIEF DESCRIPTION OF THE DRAWING

FIG. 2b shows a wiring diagram of the magnet coil system of FIG. 2a;

DESCRIPTION OF THE PREFERRED EMBODIMENT

Figure 1:
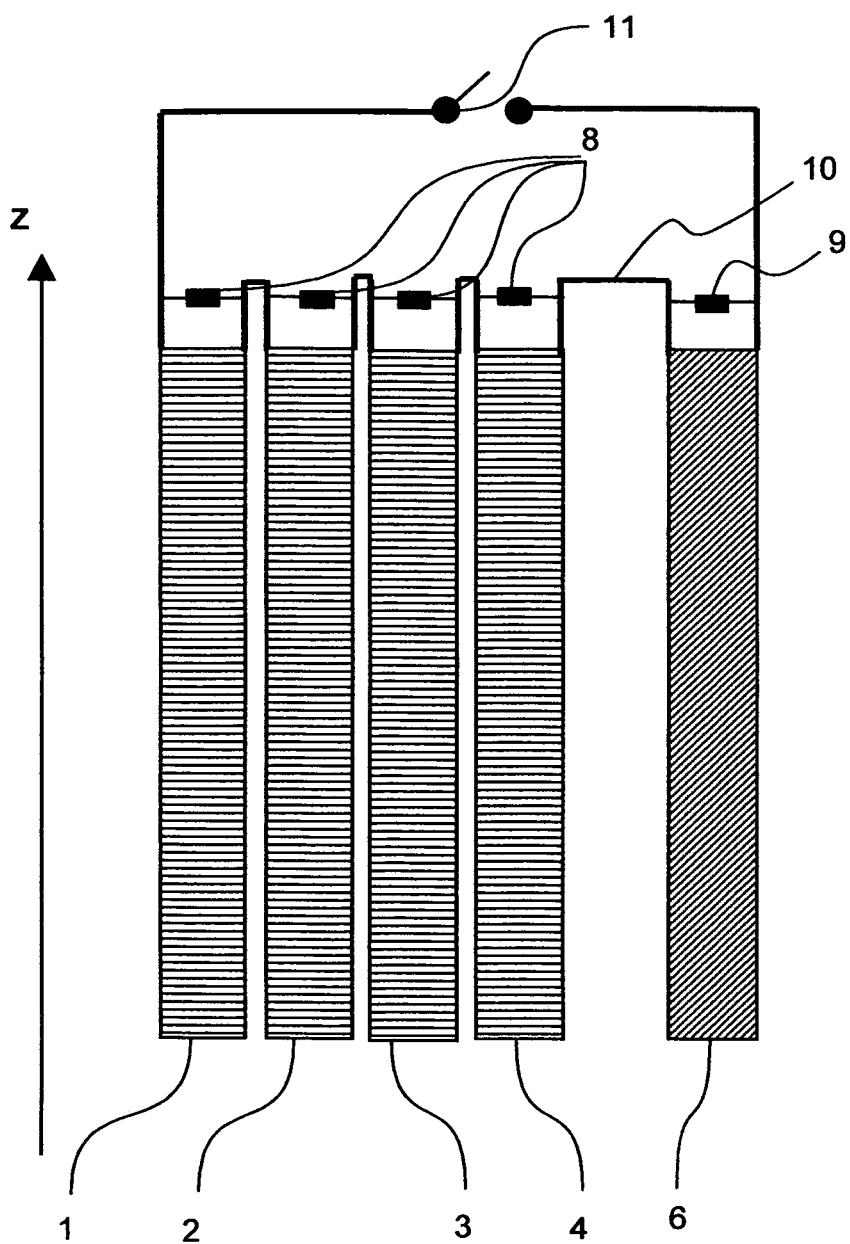
FIG. 1 shows a schematic vertical section through one half of a magnet coil system according to prior art.

FIG. 1 shows a magnet coil system according to prior art (e.g. according to Wilson, l.c) with a main field coil which is disposed about an axis z, consisting of the main coil sections 1, 2, 3, 4 and with a shielding coil 6 which radially surrounds the main field coil. It should be noted that essentially only the right-hand half of the magnet coil system is illustrated (which also applies for the other figures) for reasons of simplicity. The main field coil and the shielding coil 6 can be superconductingly short-circuited via a superconducting main switch 11. The main field coil and the shielding coil 6 are connected in series via a superconducting electrical connection 10. The main coil sections 1, 2, 3, and 4 are each separately protected by a protective resistance 8. The shielding coil 6 is also protected by its own protective resistance 9.

At least the innermost main coil section 1 of the main field coil of superconducting high-field magnet systems regularly contains a superconducting material of low mechanical strength (e.g. Nb3Sn or ceramic high-temperature superconductors). When a quench starts e.g. in the radially outer main coil section 4 of the main field coil, an excess current may be generated in the mechanically sensitive superconductor of the inner main coil section 1 due to inductive coupling between the outer main coil section 4 and the inner main coil section 1, which would be accompanied with a Lorentz force which destroys the superconductor.

This danger of an excess current is particularly great when the quench occurs at a time at which the magnetic flux greatly differs from the critical current (Ic value) of the superconductor in the inner main coil section 1. In this case, the time period between the start of the quench in the outer main coil section 4 and quench ignition in the inner main coil section is particularly long, which, due to the law of flux maintenance, causes induction of high superconducting excess currents in the superconductor of the inner main coil section 1 before the conductor of the inner main coil section 1 also quenches. A high critical temperature of the superconducting material in the innermost main coil section 1 additionally delays its quench ignition.

These high induced currents produce high Lorentz forces which can destroy the mechanically sensitive superconductor in the inner coil area. When the superconductivity in this main coil section 1 has broken down, these high currents moreover produce a great amount of heat in the superconductor, which has become normally conducting, which can burn it out.

Figure 2A:
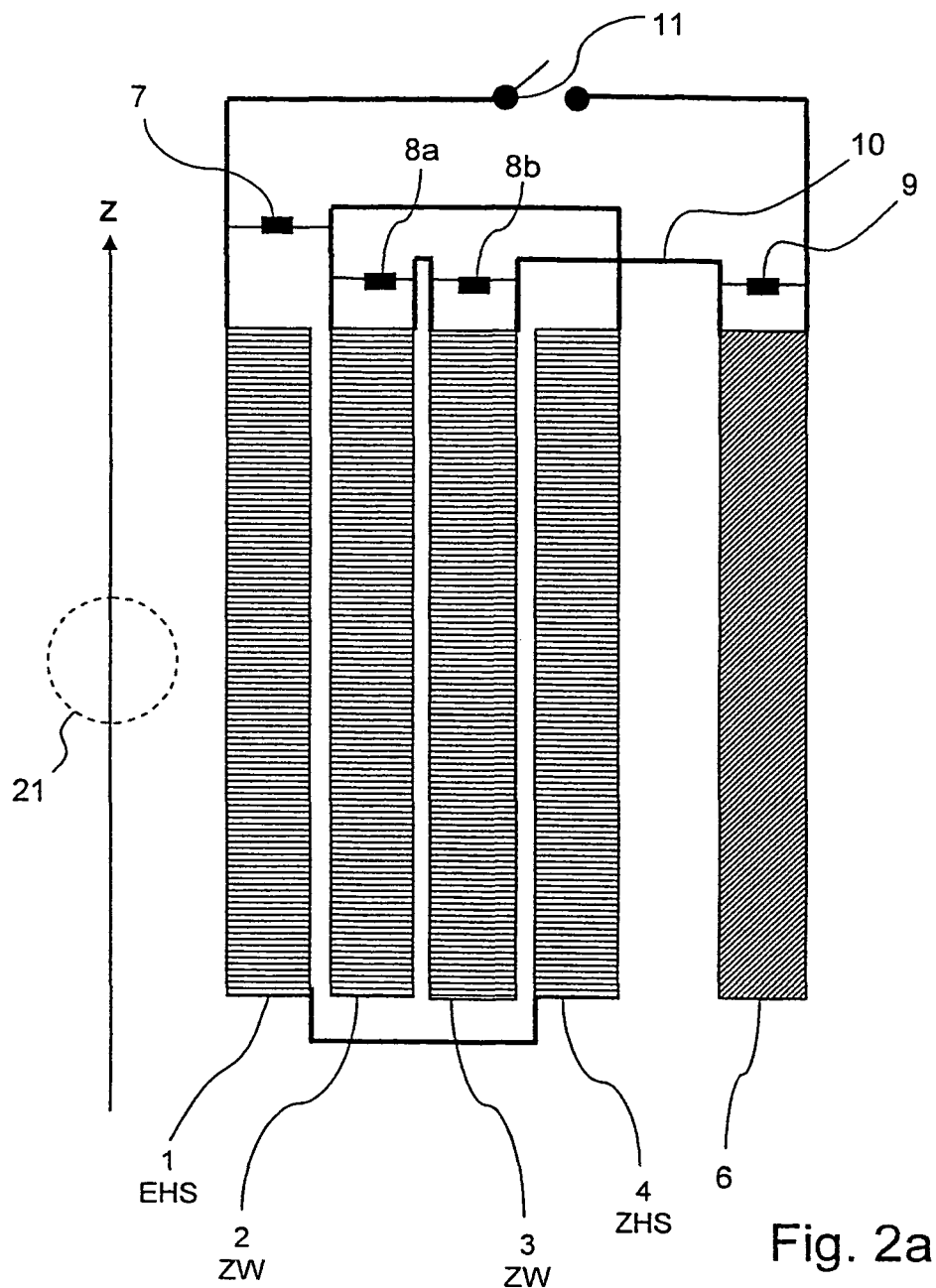
FIG. 2a shows a schematic vertical section through one half of a first embodiment of an inventive magnet coil system, with the innermost and outermost main coil section being jointly protected.
Figure 2B:
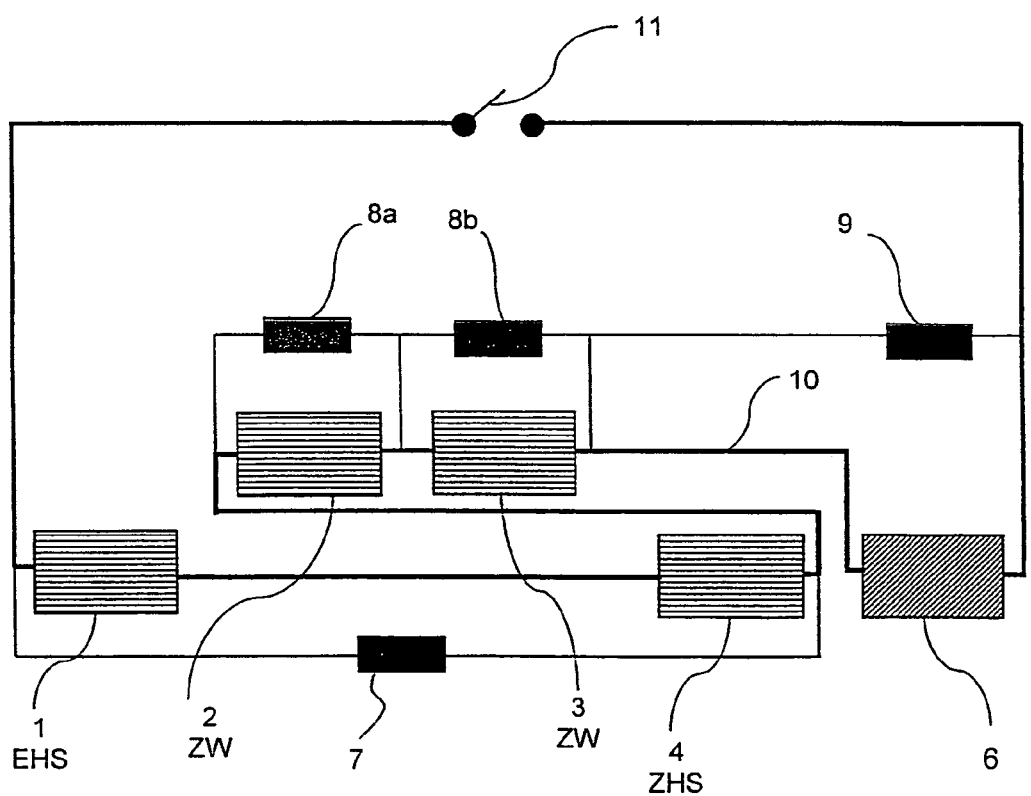

FIG. 2a shows a schematic longitudinal section of an inventive magnet coil system with a main field coil disposed about an axis z and consisting of four main coil sections (or main coil parts) 1, 2, 3 and 4 and with a shielding coil 6 which radially surrounds the main field coil. The main field coil generates a strong static magnetic field $B_0$ in the sample volume 21, which is oriented parallel with respect to the axis z. The sections 1, 2, 3, 4 are electrically connected in series and a current of the same direction flows through them during operation such that the magnetic field contributions generated by the individual sections 1, 2, 3, 4 add up in the sample volume 21. FIG. 2b supplementarily shows a circuit diagram of this magnet coil system.

The main field coil and the shielding coil 6 may be superconductingly short-circuited via a superconducting main switch 11. The main field coil and the shielding coil 6 are connected in series via a superconducting electrical connection 10. A current of opposite direction to that of the main coil flows through the shielding coil 6 such that the magnetic dipole moment generated by the shielding coil 6 is opposite to the dipole moment generated by the main field coil, thereby weakening the surrounding stray field.

The main field coil of the embodiment shown in FIGS. 2a and 2b is divided onto three loops. The first loop comprises the main coil sections 1 and 4, bridged by a common ohmic quench protection resistance 7, the second loop comprises the main coil section 2, bridged by an ohmic resistance 8a, the third loop comprises the main coil section 3, also bridged by an ohmic resistance 8b. The shielding coil 6 is also bridged by a quench protection element, i.e. an ohmic resistance 9.

This embodiment permits selective prevention of excess currents in the innermost main coil section 1.

By way of example, in FIGS. 2a and 2b, the innermost main coil section 1 as first main coil section EHS is jointly protected with the radially outermost main coil section 4 as the second main coil section ZHS. Joint protection means that both coil areas (main coil sections, main coil parts) 1 and 4 are protected in a common loop with an ohmic resistance 7. The sections 2 and 3 lie between the sections 1 and 4 as intermediate main coil sections (intermediate main coil sections, intermediate areas) ZW.

The main coil section 4 either triggers the quench in the magnet coil system and is thereby in principle not subjected to any excess current or the excess current in the radially outermost main coil section 4 is negligibly small (in view of any damage to superconductors in the main field coil) independently of the coil area in which the quench is triggered.

Since the main coil sections 1 and 4 are connected in series and the excess current in the outer main coil section 4, if any, is small, the excess current in the inner main coil section 1 also remains small. The radially inner main coil section is therefore well protected from the mechanical load of Lorentz forces, despite the fact that the conductor may contain mechanically sensitive superconducting material.

Figure 3:
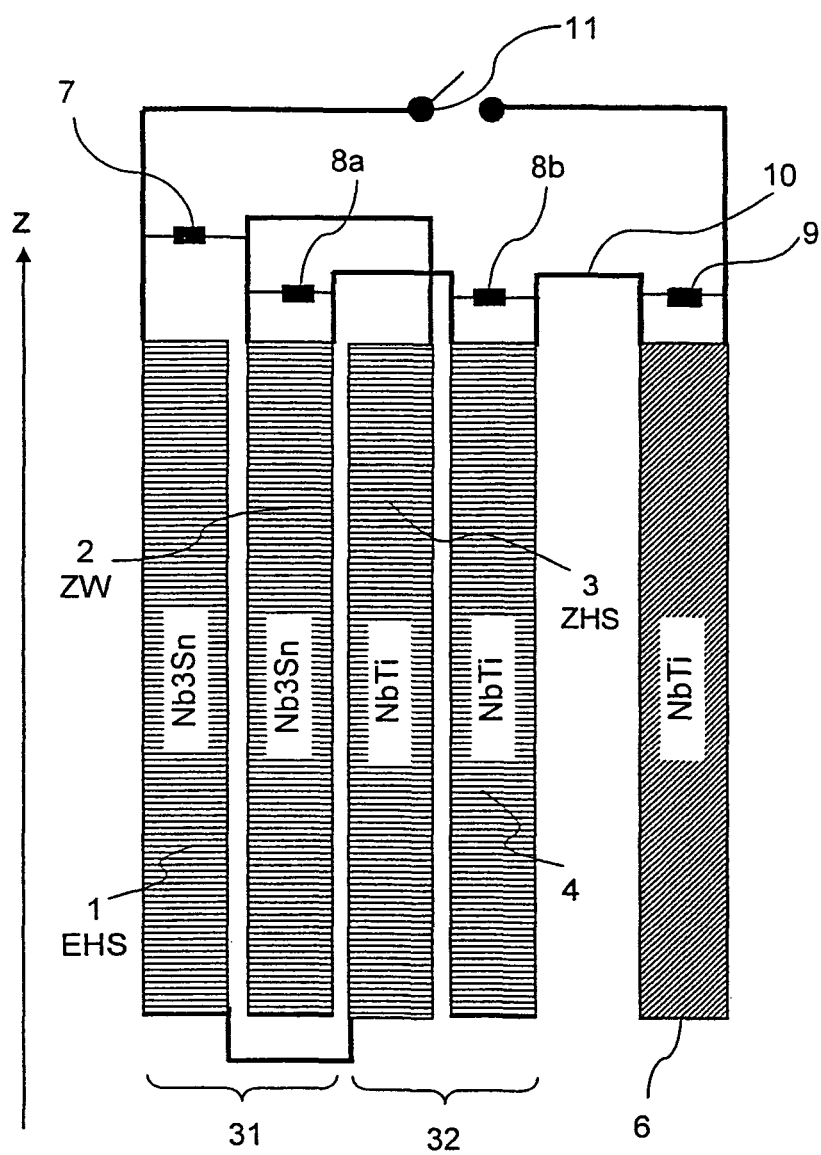
FIG. 3 shows a schematic vertical section through one half of a second embodiment of an inventive magnet coil system, with the innermost Nb3Sn and the innermost NbTi main coil section being jointly protected.

FIG. 3 shows a preferred variant of an inventive magnet coil system with a main field coil which is disposed about an axis z, consisting of the main coil sections 1 and 2 which are wound with Nb3Sn superconductor (which form a first main coil area 31 with identical superconducting material) and the main coil sections 3, 4 wound with NbTi superconductor (which form a second main coil area 32 with identical superconducting material), and with a shielding section (shielding coil) 6 which is also wound with NbTi and radially surrounds the main field coil. The main field coil and the shielding coil 6 can be short-circuited via a superconducting main switch 11. The main coil sections 2 and 4 are respectively separately protected by a protective resistance 8a, 8b and the shielding section 6 is also protected by its own protective resistance 9. The main field coil and the shielding coil 6 are connected in series via an electrical connection 10.

In this preferred variant, the innermost Nb3Sn main coil section 1 of the first main coil area 31 is protected as first main coil section EHS together with the innermost NbTi main coil section 3 of the second main coil area 32 as a second main coil section ZHS via the quench protection resistance 7. The section 2 is disposed radially between the sections 1 and 3 as an intermediate main coil section ZW.

This variant is advantageous in that the innermost NbTi conductor in section 3 operates in a high magnetic field close to its load limit and quenches very quickly due to its low critical temperature irrespective of whether the quench originated in this section 3 or in an NbTi section (in the present case section 4) disposed further outwardly. Since this common interconnection ensures that, in case of a quench, the Nb3Sn conductor of the main coil section 1 is loaded with the same low excess current as the quickly quenching superconductor in the innermost NbTi section 3 without a quench in the innermost section 1 itself, the Nb3Sn superconductor in section 1 bears only little risk of being destroyed by excessive force.

Figure 4:
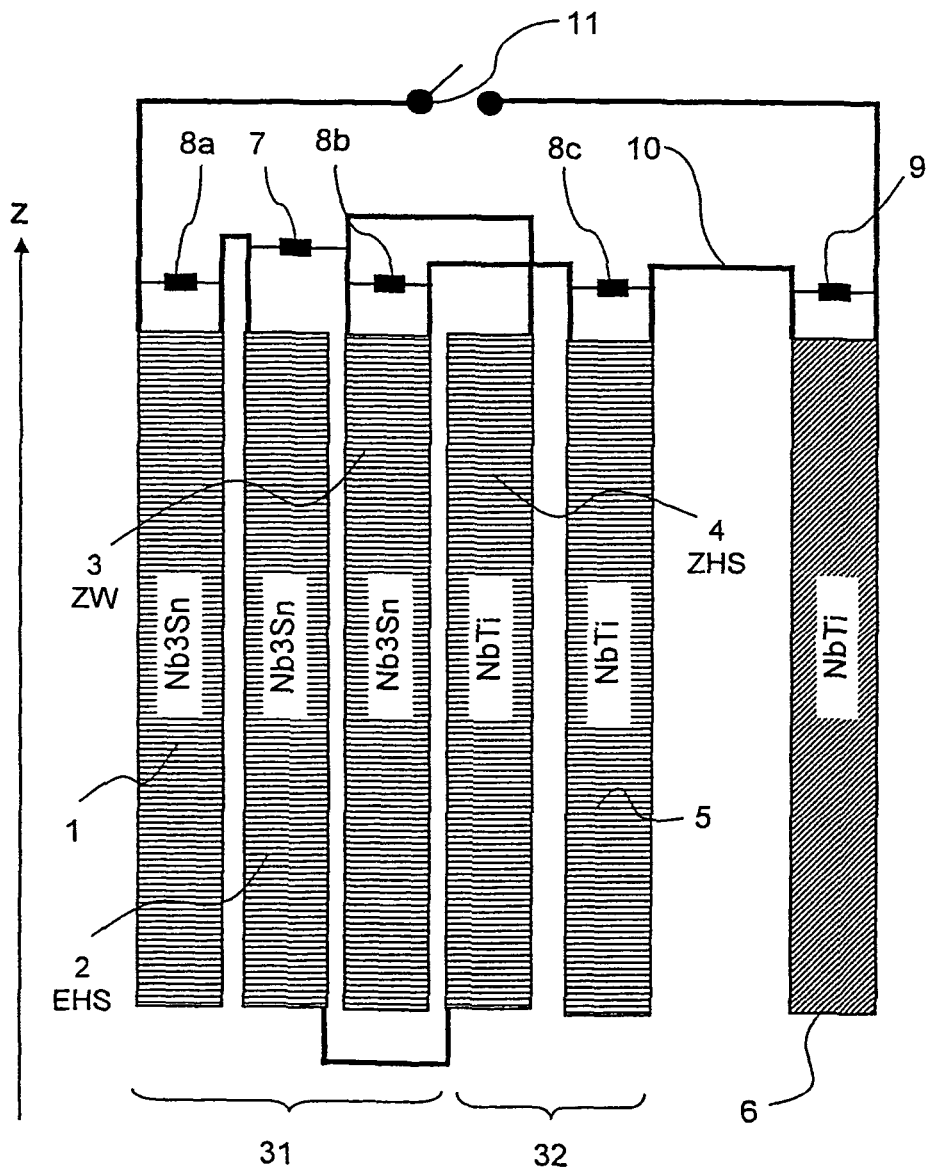
FIG. 4 shows a schematic vertical section through one half of a third embodiment of an inventive magnet coil system with the second innermost Nb3Sn and the innermost NbTi main coil section being jointly protected.

FIG. 4 shows a further feasible variant of an inventive magnet coil system with a main field coil disposed about an axis z, consisting of sections 1, 2, and 3 wound with Nb3Sn superconductor (which form a first main coil area 31), and the sections 4, 5 wound with NbTi superconductor (which form a second main coil area 32), and with a shielding coil (shielding section) 6 which is also wound with NbTi and radially surrounds the main field coil. The main field coil and the shielding coil 6 may be short-circuited via a superconducting main switch 11. In contrast to the above-mentioned variants, in this variant the second innermost Nb3Sn section 2, as first main coil section EHS, is protected with a protective resistance 7 together with the innermost NbTi section 4, as second main coil section ZHS, and not the innermost section. Section 3 is disposed radially between the sections 2 and 4 as an intermediate main coil section ZW. The sections 1, 3 and 5 are each separately protected with quench protection elements, in the present case protective resistances 8a-8c, and the shielding section 6 is separately protected by a protective resistance 9. The main field coil and the shielding coil 6 are connected in series via an electrical connection 10.

Figure 5:
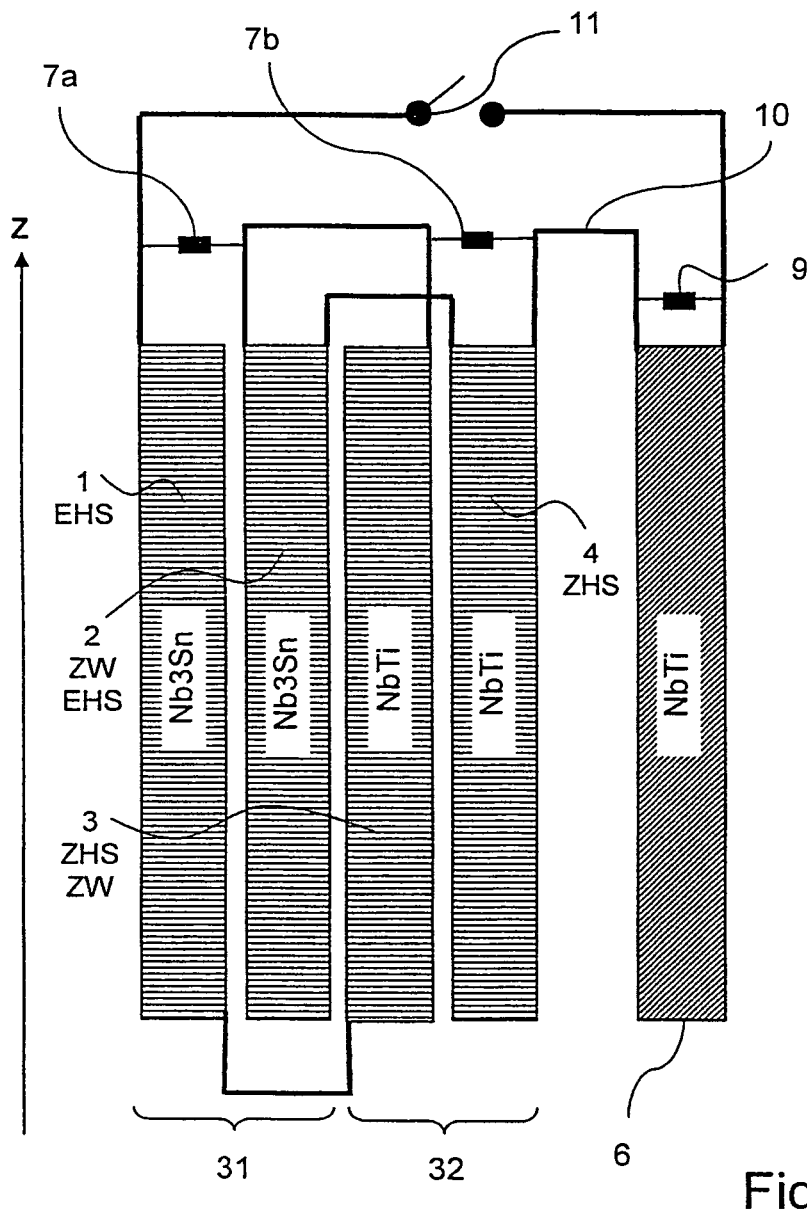
FIG. 5 shows a schematic vertical section through one half of a fourth embodiment of an inventive magnet coil system with two loops of jointly protected main coil sections.

FIG. 5 shows an embodiment of the inventive magnet coil arrangement in which the main field coil comprises four main coil sections 1, 2, 3, 4. The radially further inward main coil sections 1, 2 have conductors with Nb3Sn as superconducting material and form a first main coil area 31. The radially outermost main coil sections 3, 4 have a conductor with NbTi as superconducting material and form a second main coil area 32. The magnet coil arrangement moreover comprises a shielding coil (shielding section) 6.

The sections of the magnet coil system, in sequence (starting on the left-hand side of the main switch 11) section 1, section 3, section 2, section 4, section 6, are electrically (during regular operation superconductingly) connected in series via the main switch 11. The directly series-connected main coil sections 1 (as first main coil section EHS) and 3 (as second main coil section ZHS) are bridged by a common protective resistance 7a, thereby forming a first protective loop. It should be noted that the section 2 (as intermediate main coil section ZW) is disposed spatially (radially) between the sections 1 and 3. The directly series-connected main coil sections 2 (as further first main coil section EHS) and 4 (as further second main coil section ZHS) are bridged by a common protective resistance 7b, thereby forming a second protective loop. It should be noted that the section 3 (as a further intermediate main coil section ZW) is spatially (radially) arranged between the sections 2 and 4.

In this embodiment, the sections 1 and 2 as first main coil sections EHS are protected by the sections 3 and 4 as second main coil sections ZHS from the effects of a quench.

Figure 6:
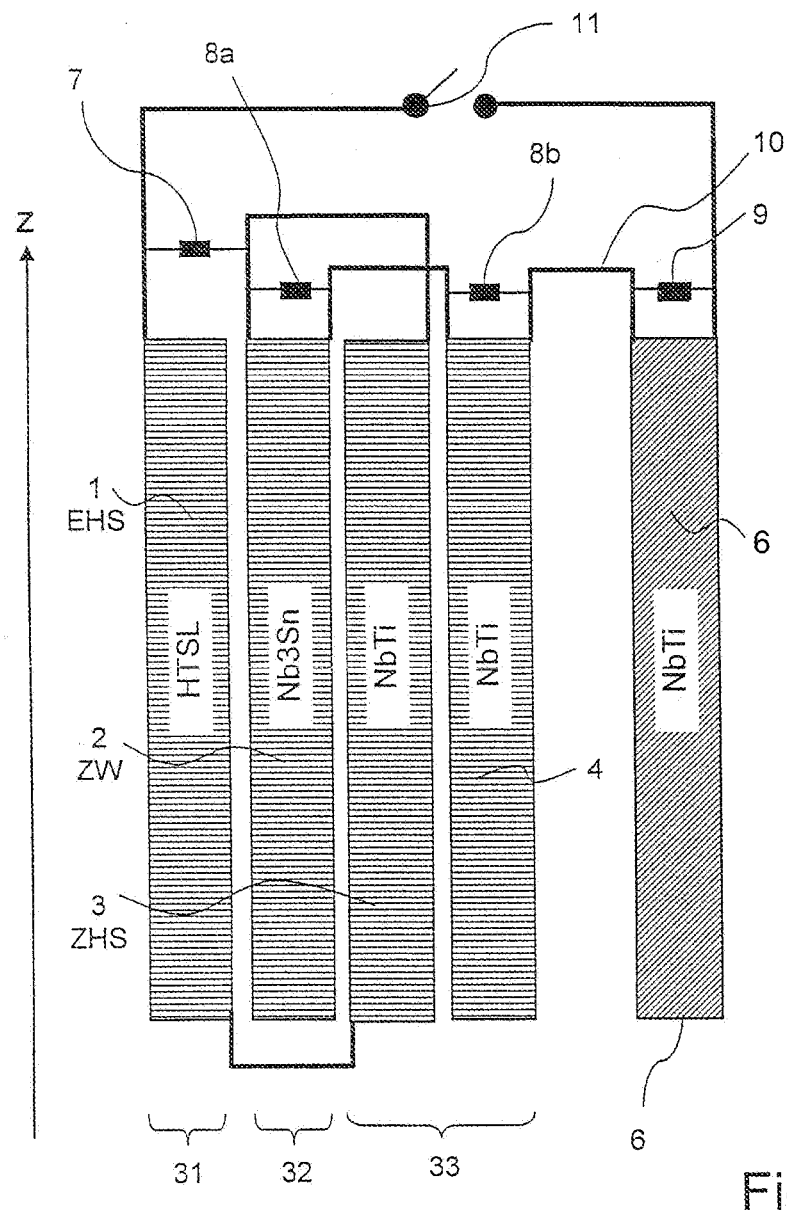
FIG. 6 shows a schematic vertical section through one half of a fifth embodiment of an inventive magnet coil system with different superconducting materials in three areas in the main field coil.

FIG. 6 finally shows an embodiment of an inventive magnet coil arrangement with a main coil forming three magnet coil areas 31, 32, 33. The radially innermost main coil section 1 has a conductor which contains a high-temperature superconductor (HTSL) as superconducting material. This forms the first radially innermost main coil area 31. The second radially central main coil area 32 is formed by a main coil section 2 with a conductor on the basis of Nb3Sn. The third radially outermost main coil area 33 is formed by two main coil sections 3 and 4, the conductor of which contains NbTi. The main coil sections 1, 2, 3, 4 are radially nested in this sequence, wherein the section 1 is the innermost and the section 4 is the outermost section. A shielding coil 6 is arranged around the main coil. The main coil and the shielding coil 6 are connected in series via an electrical connection 10 and can be superconductingly short-circuited via a main switch 11. The main coil sections 1, 2, 3, 4 are electrically interconnected in series in the following sequence: section 1, section 3, section 2, section 4.

In this embodiment, the HTSL main coil section 1 is protected as first main coil section EHS together with the radially innermost NbTi main coil section 3 of the third main coil area as second main coil section ZHS in a loop via the common protective resistance 7. The section 2 is disposed radially between the sections 1 and 3 as intermediate main coil section ZW. The sections 2, 4 and 6 are protected via their own protective resistances 8a, 8b, and 9. This prevents dangerous excess currents (or later quench which would have to be expected due to a high Tc value) in the HTSL conductor of section 1 via the NbTi section 3.

It is noted that in this embodiment, the Nb3Sn main coil section 2 can additionally also be protected via e.g. the NbTi main coil section 4 by a common protective resistance (not shown).

The high-temperature superconductor materials (in particular Bi or YBCO conductors) are particularly suitable for the highest magnetic fields, i.e. for the innermost area of a high-field magnet coil arrangement. However, these conductors are particularly vulnerable to excess currents in case of a quench, since they have low mechanical strength which can only be increased by additional reinforcing material. This reinforcing material does, however, not contribute to the current-carrying capacity and therefore basically reduces the field contribution of this coil area. On the other hand, these high-temperature superconductors quench only relatively late due to their high critical temperature and can therefore collect very large excess currents during a quench in the outer coil area, which mechanically destroy the high-temperature superconductor or also burn it out. For this reason, the interconnections described in FIGS. 2a, 3, 5 and 6 are particularly suited for magnet coil systems having these sensitive high-temperature superconductors in their innermost coil section 1. The materials Bi2212 and Bi2223 or YBCO are e.g. suited as high-temperature superconductors.

All magnet coil arrangements shown in FIGS. 1 to 6 are used for schematic illustration. The inner sections e.g. typically have a shorter length (in the z direction) than the outer sections. The separations between the main field coil and the shielding coil are also not to be understood as being to scale.

We claim:

1. A superconducting high-field magnet coil system having several radially nested main coil sections which are connected to each other in series in such a fashion that currents of a same direction flow through them during operation, the system comprising:
a first main coil section;
a second main coil section disposed radially further outward than said first main coil section;
at least one intermediate main coil section disposed radially between said first and said second main coil sections;
a superconducting switch disposed, structured and dimensioned to superconductingly short-circuit said first, said second and said intermediate main coil sections in series; and
a quench protection element, said quench protection element bridging said first and said second main coil sections, wherein said first main coil section and said second main coil section are directly successively series-connected and said quench protection element does not bridge said at least one intermediate main coil section.

2. The superconducting high-field magnet coil system of claim 1, wherein said quench protection element is selected from a group consisting of a quench protection resistance, a quench protection diode, and combinations thereof.

3. The superconducting high-field magnet coil system of claim 1, wherein the superconducting high-field magnet coil system further comprises a shielding coil which is connected in series with said first, said second and said intermediate main coil sections in such a fashion that, during operation, a current of opposite direction flows through said shielding coil and said first, said second and said intermediate main coil sections.

4. The superconducting high-field magnet coil system of claim 3, wherein said shielding coil is bridged by a second quench protection element.

5. The superconducting high-field magnet coil system of claim 1, wherein the high-field magnet coil system further comprises at least one further main coil section which is disposed radially within said first main coil section and/or radially outside of said second main coil section.

6. The superconducting high-field magnet coil system of claim 1, wherein said first main coil section is a radially innermost main coil section of the superconducting high-field magnet coil system.

7. The superconducting high-field magnet coil system of claim 1, wherein a radially innermost main coil section of the superconducting high-field magnet coil system is bridged by a third quench protection element.

8. The superconducting high-field magnet coil system of claim 1, wherein said second main coil section is a radially outermost main coil section of the superconducting high-field magnet coil system.

9. The superconducting high-field magnet coil system of claim 1, wherein a radially outermost main coil section of the superconducting high-field magnet coil system is bridged by a fourth quench protection element.

10. The superconducting high-field magnet coil system of claim 1, wherein a first superconducting material of a conductor of said first main coil section has a higher critical magnetic field than a second superconducting material of a conductor of said second main coil section.

11. The superconducting high-field magnet coil system of claim 10, wherein each main coil section of a radially inner main coil area has a conductor with said first superconducting material and each main coil section of a radially outer main coil area has a conductor with said second superconducting material.

12. The superconducting high-field magnet coil system of claim 11, wherein said second main coil section is a radially innermost main coil section of said radially outer main coil area.

13. The superconducting high-field magnet coil system of claim 1, wherein a first superconducting material of a conductor of said first main coil section is selected from a group consisting of Nb3SN, Nb3Al, MgB2, a ceramic high-temperature superconducting material, YBCO, Bi2212, Bi2223, and combinations there of.

14. The superconducting high-field magnet coil system of claim 1, wherein a second superconducting material of a conductor of said second main coil section comprises NbTi.

15. The superconducting high-field magnet coil system of claim 1, wherein each main coil section of a radially inner main coil area has a conductor with a high-temperature superconducting material, each main coil section of a radially central main coil area has a conductor with Nb3Sn and each main coil section of a radially outer main coil area has a conductor with NbTi.

16. The superconducting high-field magnet coil system of claim 1, the system further comprising:

an additional first main coil section;

an additional second main coil section disposed radially further outward than said additional first main coil section;

at least one additional intermediate main coil section disposed radially between said additional first and said additional second main coil sections; and an additional quench protection element, said additional quench protection element bridging said additional first and said additional second main coil sections, wherein said additional first main coil section and said additional second main coil section are directly successively series-connected and said additional quench protection element does not bridge said at least one additional intermediate main coil section.

17. The superconducting high-field magnet coil system of claim 16, wherein a first critical magnetic field strength of a first superconducting material of a first conductor of said first main coil section is larger than a second critical magnetic field strength of a second superconducting material of a second conductor of said second main coil section and an additional first critical magnetic field strength of an additional first superconducting material of an additional first conductor of said additional first main coil section is larger than an additional second critical magnetic field strength of an additional second superconducting material of an additional second conductor of said second main coil section.

18. The superconducting high-field magnet coil system of claim 1, wherein main coil sections which are not bridged by a common quench protection element are each bridged by an individual respective quench protection element.

19. The superconducting high-field magnet coil system of claim 1, wherein the system generates a magnetic field with a magnetic field strength of $B_0 \geq 9$ tesla or $B_0 \geq 17$ tesla.

20. An NMR measuring apparatus, an NMR spectrometer or an MRI tomograph comprising the superconducting high-field magnet coil system of claim 1.

* * * * *